United States Patent [19]

Walls

[11] 4,122,408

[45] Oct. 24, 1978

[54] FREQUENCY STABILIZATION UTILIZING MULTIPLE MODULATION

[75] Inventor: Fred Lexes Walls, Boulder, Colo.

[73] Assignee: The United States of America as represented by the Secretary of Commerce, Washington, D.C.

[21] Appl. No.: 851,326

[22] Filed: Nov. 14, 1977

[51] Int. Cl.$^2$ .............................................. H03B 3/12

[52] U.S. Cl. .............................................. 331/3; 331/9

[58] Field of Search .............................. 331/3, 1, 9, 94; 324/0.5

[56] References Cited

U.S. PATENT DOCUMENTS

| | | | |
|---|---|---|---|
| 2,926,310 | 2/1960 | Winkler | 331/3 |
| 2,927,278 | 3/1960 | Dicke | 331/3 |
| 2,933,696 | 4/1960 | Reder et al. | 331/3 |
| 3,792,368 | 2/1974 | Audoin | 331/3 |

OTHER PUBLICATIONS

H. Hellwig, Metrologia 6, 2, 56 (1970).

H. Hellwig, H. E. Bell, Metrologia 8, 96 (1972).

Walls & Hellwig, Proc. 30th Ann. Freq. Control Symp. (1976).

Walls, Proc. 8th Ann. Precise Time & Time Interval App. and Plan. Meet. (1976).

*Primary Examiner*—John Kominski

*Attorney, Agent, or Firm*—Eugene J. Pawlikowski; Alvin J. Englert

[57] ABSTRACT

A system and method is disclosed for achieving frequency stabilization. A tunable element, such as a cavity structure, is stabilized through the use of multiple modulation to stabilize both the resonant frequency of the cavity structure and the probe signal coupled to an atomic, molecular or other reference resonance line. Said reference resonance line can be internal or external to the cavity structure. A local oscillator provides a carrier signal, which typically can be at a frequency of 5 MHz, with the carrier signal being phase or frequency modulated by multiple modulating signals, such as, for example, by modulating signals with frequencies of 12.2 KHz and 0.4 Hz, and the multiple modulated carrier signal then processed and the resulting probe signal coupled to the cavity structure substantially at a preselected frequency, which frequency can be approximately 1420 MHz for a hydrogen frequency standard useful for atomic clocks. The output signal coupled from the cavity structure is amplitude modulated with the modulation at the fundamental and odd harmonics of the first modulation frequency having a level proportional to any frequency offset between the probe signal and the atomic, molecular or other reference resonance line, and the modulation at the fundamental and odd harmonics of the second modulation frequency having a level proportional to any frequency offset between the cavity frequency and the frequency of the probe signal. The output signal from the cavity is processed and ultimately rectified so that various amplitude modulations on the output signal can be recovered. The error signal resulting from synchronous detection of the amplitude modulation signal of the second frequency, 12.2 KHz in this example, or odd harmonics thereof, is coupled to the tuning element of the cavity tuning control circuitry to precisely tune the resonant frequency of the cavity to the frequency of the probe signal and the error signal resulting from synchronous detection of the amplitude modulation signal of first frequency, 0.4 Hz in this example, or odd harmonics thereof, is coupled to the local oscillator to adjust the frequency so that the probe signal is maintained at the center of the resonance of the atomic, molecular or other reference resonance and to thereby stabilize the resonant frequency of the cavity and the output frequency of the device over a long term.

33 Claims, 8 Drawing Figures

ISOLATION
-120db
-120dB
5 MHz OUTPUTS
PHASE MODULATOR
MULTIPLIER x288
1440 MHz
1420 MHz CAVITY
STORAGE BULB
1420 MHz
HBEAM
CAVITY CONTROL
1420 MHz
1440 MHz
20 MHz
0.4 Hz REF
12.2 KHz REF
÷1600
÷N
SYNTHESIZER ≈20 MHz
12.2 KHz DETECTOR & PHASE LOCK
12.2 KHz REF
NARROW BAND FILTER
≈.4 Hz REF
≈.4 Hz DETECTOR & PHASE LOCK
5.000,000 MHz

BEAT PERIOD
100 PERIOD AVERAGE
900
38.10800
700
BEAT PERIOD (S)
1x 10^-13
1 DAY
TIME 2000
1000
0
CAVITY CORRECTION (Hz)
CAVITY FREQUENCY CONTROL

1 DAY
TIME 38.112
.111
.110
.109
.108
.107
.106

BEAT PERIOD (S)
(10 PERIOD AVE.)
AVE
AVE
AVE
1 X 10^-13
4.11 PASCALS
5.47 PASCALS
4.11 PASCALS
PRESSURE

FREQUENCY STABILIZATION UTILIZING MULTIPLE MODULATION

ORIGIN OF THE INVENTION

The invention described herein was made by an employee of the United States Government and may be manufactured and used by or for the Government for governmental purposes without the payment of any royalties thereon or therefor.

FIELD OF THE INVENTION

This invention relates to frequency stabilization of a tunable element and, more particularly, relates to a multiple modulation system and method for achieving frequency or length stabilization of a tunable element such as a resonant cavity structure to an atomic, molecular or other reference resonance line. In the case of frequency standards, length standards, and other devices using the methods of frequency control, such cavity stabilization greatly reduces the instability in realizing the frequency of the atomic, molecular, or other reference resonance line caused by changes in cavity pulling.

BACKGROUND OF THE INVENTION

It is oftentimes necessary that tunable elements such as cavities or resonant structures coupled to a reference line of interest be frequency stabilized, at least to some degree, so that frequency of the output signals derived from the reference line are dependable for utilization purposes. Alternately, it is oftentimes desireable to stabilize the frequency of length of a cavity to a reference resonance line.

Where the device is to operate as a frequency standard, frequency stability is vital and such stability must be made to extend over a long term for best utilization of such a standard. Likewise, where the device is to operate as a length standard, length stability must be made to extend over as long a time as possible.

Frequency standards, clocks, and length standards of many configurations have been heretofore proposed and/or utilized based on atomic, molecular, or other resonance lines. Such devices have heretofore normally depended, for stability, upon the stability of the components, and this was particularly true where resonant cavities were utilized. Such cavities have commonly heretofore been made stable by using stable materials such as fused quartz, Cervit, ULE quartz, etc.

The long term stability of such devices, however, at least in some configurations, has been limited by a plurality of factors one of the most important being cavity pulling. Cavity pulling is due to the radiation used to probe the atomic, molecular, or other reference resonance line of such a device also being coupled to other resonant structures (typically cavities of some sort) which can change the apparent center of the reference resonance so that the output signal is perturbed (pulled) by the detuning of the cavity. In the case where the atomic, molecular or other resonance line is observed by sampling the same radiation that probes the resonance, then the shift of the apparent center of the resonance is on the order of $$(\Delta\nu/\nu) = (Q_c/Q_R)\,(\nu_R - \nu_c)$$

where $Q_c$ is the quality factor of the cavity (resonant frequency divided full width at one-half power), $Q_R$ is the quality factor of the atomic or molecular resonance of interest, and $(\nu_R - \nu_c)$ is the detuning of the cavity from the atomic or molecular resonance.

For a hydrogen maser frequency standard, $Q_R$ is the quality factor of the hydrogen resonance (1,0 to 0,0 transition in the ground state of atomic hydrogen) with $(\nu_R - \nu_c)$ being the detuning of the cavity resonant frequency from the hydrogen resonance. In order to achieve a stability of $10^{-14}$, $\Delta\nu$ must be smaller than $1.4 \times 10^{-5}$ Hz. Present hydrogen masers typically have a cavity quality factor on the order of 30,000 and a hydrogen line $Q_R$ of $10^9$. Limits of about these values are imposed by the need to sustain oscillation. This requires a cavity stability of 0.5 Hz or a fractional stability of $3 \times 10^{-10}$ for a mechanical cavity nearly 30 centimeters in diameter and 30 centimeters tall. In addition to its mechanical size, the electrical properties of the cavity depend on the coupling loops to external amplifiers and surface conditions. Any of the previous factors are more than sufficient to fractionally change the cavity resonance by more than $3 \times 10^{-10}$ in long-term.

The present success in using the hydrogen maser as a stable frequency standard is directly traceable to the use of spin exchange collisions between hydrogen atoms to compensate for the cavity pulling (see e.g. S. B. Crampton Ph.D thesis Harvard University 1964 and also U.S. Pat. No. 3,792,368). Briefly, the density of atomic hydrogen is modulated and the cavity tuned until no frequency or alternately no phase change occurs synchronously with the hydrogen modulation. This presently requires a minimum of two hydrogen masers to be even partly successful and experimentally still has not proved able to produce stabilities below $\sim 10^{-14}$ for measurement times greater than a few days even though attempts have been made by a number of groups over a period of 10 years.

The cavity pulling effect also applies to devices which do not sample the radiation responsible for causing the atomic, molecular or other resonance transition of interest. In devices like Cesium frequency standards, for example, the detection is based on some secondary process which is proportional to the number of atoms undergoing the appropriate transition. In this case, the cavity pulling is on the order of $$\Delta\nu = (Q_c/Q_R)^2(\nu_R - \nu_c)$$

and typically is much less important. However, in some special cases it is still necessary to stabilize the resonance cavity in which case this invention could be used.

An atomic clock or frequency standard utilizing a source of atomic hydrogen in conjunction with a tuned cavity and local oscillator is shown, for example, in U.S. Pat. No. 3,792,368. In this patent, a device and method are taught for tuning the resonant frequency of the microwave cavity of a maser oscillator to approximately the transition frequency of the stimulated emission of the active medium of the maser. In this method the resonant frequency of the microwave cavity is corrected using the error signal obtained by synchronously detecting the phase modulation of the maser oscillator caused by modulation of the oscillation amplitude. Multiple modulation techniques, however, are not utilized for achieving frequency stability, neither is the cavity detuning detected by inserting a phase modulated probe frequency.

Hydrogen frequency standards, whether active or passive, are based on the $F = 1$, $mf = 0$ to $F = 0$, $mf =$ 0 hyperfine transition at 1420 MHz in the ground state of atomic hydrogen. In the typical active type of hydrogen maser, wherein no microwave signal is injected into the cavity, various parameters are adjusted, (such as hydrogen beam intensity, storage time, cavity Q, etc.) so that the energy radiated by the hydrogen atoms can be made to exceed cavity losses, and the system breaks into oscillation. The weak signal produced (about $10^{-12}$ to $10^{-14}$W) is then phase compared with a local oscillator, using mulitplication and hetrodyne techniques in order to preserve signal-to-noise. The output of the phase comparator is then used to phase-lock the local oscillator to the hydrogen signal.

Several passive hydrogen frequency standards have also been heretofore suggested. The first known passive frequency standard was proposed and built by H. Hellwig in 1970 [see H. Hellwig, Metrologis 6,56 (1970) and H. Hellwig, H, Bell Metrologia 8,96, (1972)]. In this type of hydrogen frequency standard, a microwave signal is injected into the cavity region. Phase comparison of the output signal with the input signal allows frequency locking of the local oscillator to the hydrogen phase dispersion signal. In the system utilized, the hydrogen signal was separated from other dispersive effects by square wave modulating the H signal at $\sim 1$ Hz via hydrogen beam modulation or Zeeman quenching and detecting the resulting phase modulation with a 1Hz synchronous detector. A frequency stability of $2 \times 10^{-12}\tau^{-\frac{1}{2}}$ in a 30 Hz bandwidth for measurement times from 1 to 100 $s$ were obtained using this system.

For timekeeping applications, at least one main goal is to minimize the time dispersion over many days or even years if possible. At present, the best that has been accomplished with any frequency standard, including hydrogen and cesium standards, is several parts in $10^{-13}$ per year with the only possible exceptions being the primary cesium standards. Requirements in navigation, such as for global positioning systems, are roughly equivalent to a frequency stability of $1 \times 10^{-14}$ for 10 days. Thus, systems and methods for achieving even better long-term stability are still desirable, particularly where such systems and methods can offer more stability, be of lower cost, and/or involve structures of reduced volume and/or weight.

In addition, systems and methods are also desirable that have the capability of substantially eliminating cavity pulling, with such systems and methods being applicable to frequency standards and also to other applications, including external cell stabilized lasers, where stabilization of cavity resonance frequency which is determined by its length is important, and also including devices which use the methods of frequency control for the purpose of metrology such as a magnetometer whose sensor is a resonance line whose frequency is proportional to the magnetic field, etc.

SUMMARY OF THE INVENTION

This invention provides an improved frequency stabilizing system and method that is capable of achieving long-term stability. This system and method is particularly useful for stabilizing a cavity resonance frequency and when utilized with a frequency standard provides enhanced stability over a long period of time by substantially eliminating cavity pulling.

This system and method can also be used to eliminate cavity pulling and hence systematic errors in devices which use a reference resonance line as an environmental sensor.

The system and method of this invention substantially eliminates cavity pulling as an important long-term systematic effect in frequency standards and has demonstrated a fractional frequency stability, for example, of $2 \times 10^{-15}$ in a noise bandwidth of 1 Hz at a measurement time of 4 days using only a single frequency stabilized device. The invention is particularly important in its impact on the required engineering effort. For example, in a high quality hydrogen maser, the cavity is a very elaborate structure which accounts for approximately 70% of the total parts cost. Using this invention, the cavity can be reduced in size and weight and made more rugged at a cost of about 2 to 6% of the known cavities.

In addition, this invention allows the stability of the presently utilized masers or lasers to be improved by utilizing the stabilization system of this invention. Also, with respect to many external cell stabilized laser standards, the cell has a Q factor comparable to the atomic or molecular resonance transition of interest. Here again, the cavity pulling dominates long-term stability and is remedied by this invention.

This invention is particularly useful for hydrogen frequency standards in that it will make them approximately comparable to presently known Cesium standards in size, weight, cost, etc., with such hydrogen frequency standards being five to ten times more stable at any measurement time.

The system and method of this invention preferably utilizes multiple phase or frequency modulation of a probe signal which is injected into the cavity region of the device to be stabilized and coupled to the atomic, molecular, or other reference resonance line to thus achieve the desired end by probing the resonance line of interest and the cavity structure, with the modulating signals interacting with the various resonances at a strength which depends primarily upon the quality factors, modulation widths, and frequency offsets to produce different signals which are then used to stabilize the resonant frequency of the cavity structures and the local probe signal to the atomic, molecular, or other resonance line of interest, thereby also stabilizing the local oscillator.

It is therefore an object of this invention to provide an improved frequency stabilizing system and method.

It is another object of this invention to provide an improved frequency stabilizing system and method for providing long term frequency stability for a device connected therewith.

It is still another object of this invention to provide an improved frequency stabilizing system and method that is more stable yet less expensive and of reduced volume and/or weight than previous designs.

It is still another object of this invention to provide an improved frequency stabilizing system and method for stabilizing the frequency of a local oscillator.

It is still another object of this invention to provide an improved frequency stabilizing system and method for stabilizing the output frequency of a device to an atomic, molecular, or other reference line.

It is still another object of this invention to provide an improved system and method for stabilizing the length of a cavity or interferometer to an atomic, molecular, or other reference line.

It is still another object of this invention to provide an improved system and method for use in devices which use an atomic, molecular or other reference line as an environmental sensor.

It is still another object of this invention to provide an improved frequency stabilizing system and method for stabilizing a cavity resonant frequency.

It is yet another object of this invention to provide an improved frequency stabilizing system and method for use in a frequency standard.

It is still another object of this invention to provide an improved frequency stabilizing system and method utilizing multiple modulation of a signal injected into the cavity region of an associated frequency standard.

With these and other objects in view, which will become apparent to one skilled in the art as the description proceeds, this invention resides in the novel construction combination, and arrangement of parts substantially as hereinafter described, and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which.

DESCRIPTION OF THE INVENTION

Figure 1:
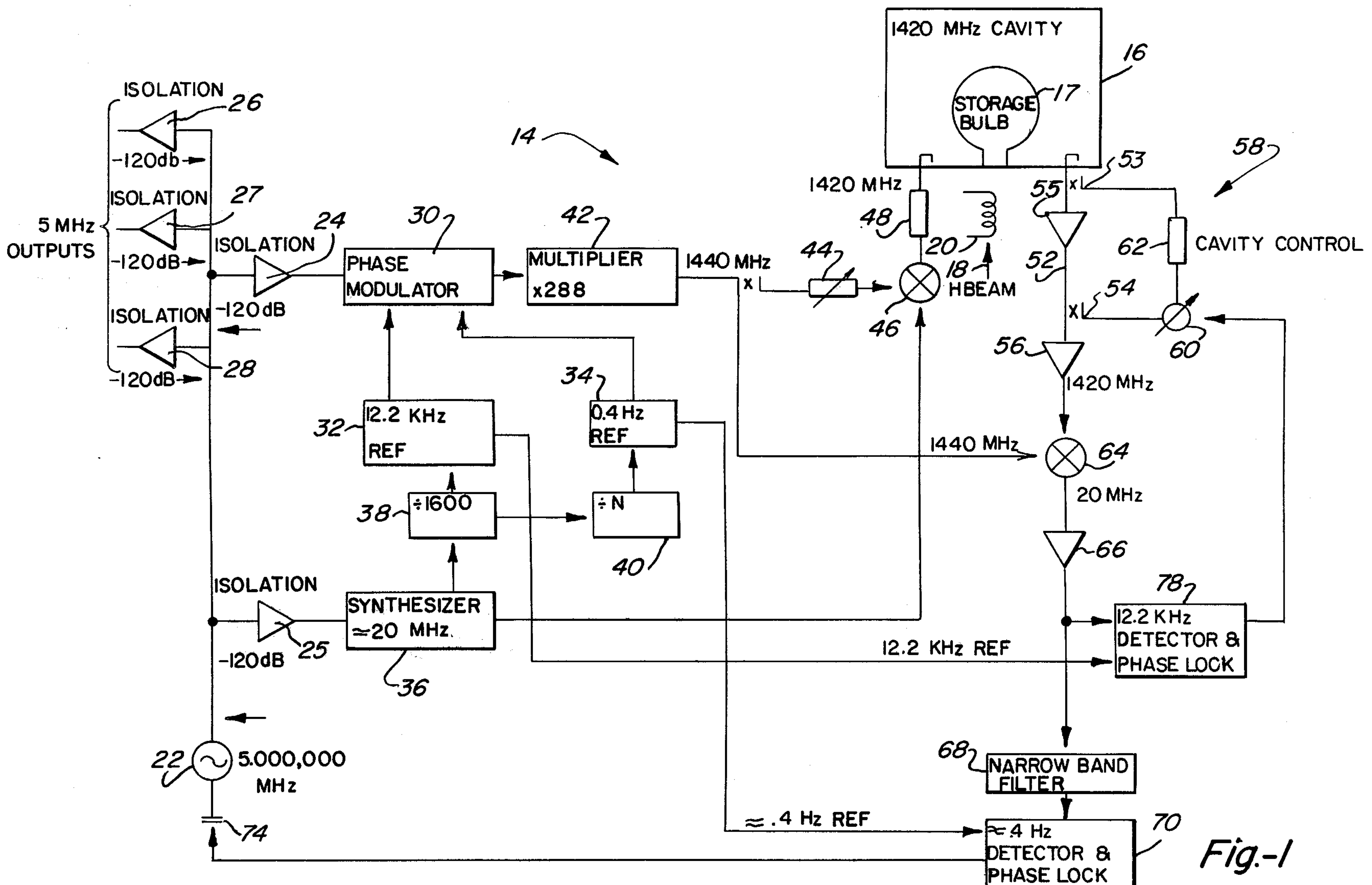
FIG. 1 is a block diagram of this invention shown connected to stabilize a passive hydrogen maser frequency standard.

As shown in the drawings and following description multiple phase or frequency modulation frequencies may be placed on a carrier signal in order to probe the resonance line of interest and the cavity structures which are coupled to the atomic, molecular, or other resonance line of interest. When so done, the different carrier modulation frequencies interact with the various resonances with a strength which depends primarily on the quality factors, modulation widths, and frequency offsets. The resulting signals can then be utilized to stabilize the resonant frequency of the cavity structure and the local probe signal to the atomic or molecular resonance.

In this realization of the invention, the essential ingredient of the carrier modulation is that it be done in such a way that (residual) amplitude modulation at the output modulating frequencies of interest present on the probe signal coupled to the reference line and cavity structure be smaller than the allowable error signals (amplitude modulation) from the cavity structure and the reference line.

A block diagram of the system 14 used to demonstrate the invention in the case of atomic hydrogen is shown in FIG. 1. The microwave cavity 16 with storage bulb 17 therein, atomic hydrogen source 18, and magnetic field configuration 20 are similar to the designs used in conventional masers and an atomic hydrogen source is shown and discussed, for example, in U.S. Pat. No. 3,792,368.

A 5 MHz crystal controlled oscillator 22 is distributed through five −120 dB isolation amplifiers 24–28. Three outputs from the system (from isolation amplifiers 26, 27, and 28) are for measurement purposes, and the other two outputs (from isolation amplifiers 24 and 25) drive internal electronics.

The 5 MHz signal is coupled through isolation amplifier 24 to phase modulator 30 where the 5 MHz carrier signal is phase modulated at 12.2 KHz and $\simeq$ 0.4 Hz supplied to the phase modulator from 12.2 KHz reference source 32 and $\simeq$ 0.4 Hz reference source 34. As shown, the output signal from isolation amplifier 25 is coupled to synthesizer 36 (tuned to $\simeq$ 20 MHz), the output of which is coupled through divide by 1600 ($\div$1600) circuit 38 to 12.2 KHz reference source 32, and through $\div$1600 circuit 38 and divide by N ($\div$N) circuit 40 to 0.4 Hz reference source 34.

The multiple phase modulated carrier output signal from phase modulator 30 is coupled to multiplier 42 ($\times$288) to provide a multiple modulated signal at 1440 MHz and then coupled through a variable resistance 44 to mixer 46 where the signal is mixed with the synthesized signal from synthesizer 36 to produce a probe signal at the hydrogen resonance frequency of approximately 1420 MHz, which probe signal is then coupled to the cavity region through resistance 48.

It is meant to be realized that the modulation impressed on the probe signal could be accomplished in a variety of manners and introduced at a variety of points.

The output signal (at 1420 MHz amplitude modulated by the fundamental and harmonics of the multiple phase modulating signals) from the cavity is coupled to output circuitry 52 which includes directional couplers 53 and 54 and amplifiers 55 and 56 connected with cavity control circuitry 58. While the output is shown taken directly from the transmitted signal, it is to be realized that a reflected signal could be utilized if desired. Cavity controlled circuitry 58 may include a variable tuning element 60 and a resistance 62. The 1420 MHz output signal is mixed at mixer 64 with the 1440 MHz reference frequencies from multiplier 42 to provide a 20 MHz output signal. Such reference frequency could be obtained from a separate multiplier similar to multiplier 42 driven from the output of isolation amplifier 26, or from a stable local oscillator. The 0.4 Hz phase modulation probes the hydrogen resonance which produces amplitude modulation at 0.4 Hz, the size of which is proportional to the frequency offset between the probe signal and the hydrogen resonance. The 0.4 Hz amplitude modulation is then observed as 0.4 Hz amplitude modulation of the 20 MHz signal. After amplification by amplifier 66 and filtering in narrow band filter 68, this signal is demodulated by the 0.4 Hz detector and phase lock circuit 70 (a synchronized detector receiving the 0.4 Hz reference input from reference source 34) to produce a DC error signal which is coupled to the tuning capacitor 74 of the 5 MHz local oscillator 22 (preferably a voltage controlled oscillator) and is used to correct the frequency of the oscillator 22. The attack time of this frequency lock loop is limited by the 0.4 Hz modulation rate and is typically a few seconds.

In a very similar way the cavity detuning from the probe frequency is sensed by detecting the 12.2 KHz amplitude modulation on the 20 MHz signal from amplifier 66. This 12.2 KHz signal is amplified, filtered, and demodulated by the 12.2 KHz detector and phase lock circuit 78 (also a synchronous detector receiving the 12.2 KHz reference signal from reference source 32) to produce an error signal which is used to correct the cavity frequency.

Since the probe signal is automatically steered to the center of the hydrogen resonance frequency via the 0.4 Hz servo, the cavity frequency is tuned to the hydrogen resonance frequency. The 12.2 KHz sidebands due to the phase modulation are $-10$ db relative to the carrier and equal in amplitude to several parts per million. The signal-to-noise in the cavity servo loop is such that the cavity frequency can be detected with a resolution of 5 Hz in only a few seconds. The present servo attack time is 10 *s* which allows rapid correction of cavity offset due to any environmental perturbation, such as changes in pressure, aging of the cavity coating, deformation of the cavity due to strain or sudden shock or even changes in cavity pulling due to changes of the coupling to the amplifier. The cavity also could have been tuned using a varactor diode or other variable reactance coupled to the cavity, or by the movement of a mechanical tuning element, or by a change in temperature, or by mechanical deformation, or any combination thereof. This cavity servo scheme should have virtually no effect on hydrogen resonance line due to the small size of the 12.2 kHz sidebands and their high symmetry about the hydrogen resonance.

The 0.4 Hz and 12.2 KHz phase detectors (synchronous detectors) could have been replaced by phase detectors operating on virtually any odd harmonic of the 0.4 Hz and 12.2 KHz phase modulation signals.

Figure 2:
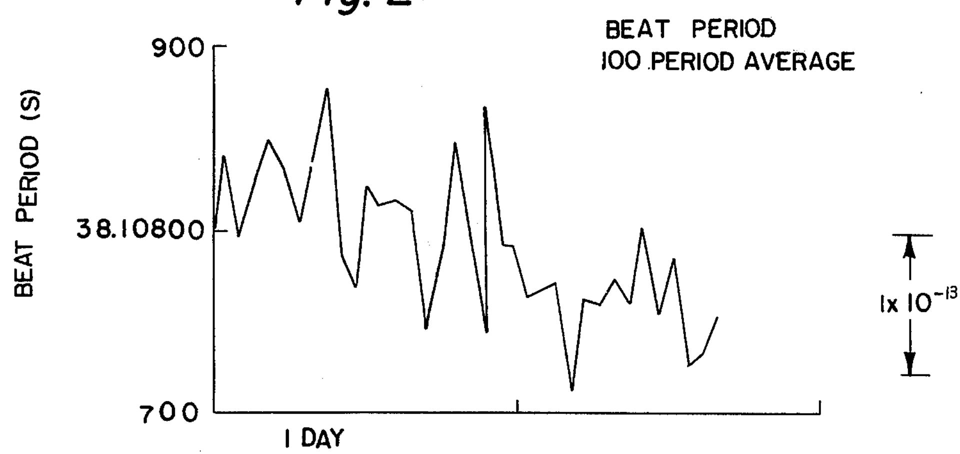
FIG. 2 is a graph showing the beat period between a U.S. Bureau of Standards frequency standard known as NBS-6 and the stabilized passive hydrogen maser as shown in FIG. 1 during a temperature transient of 0.7° C.
Figure 3:
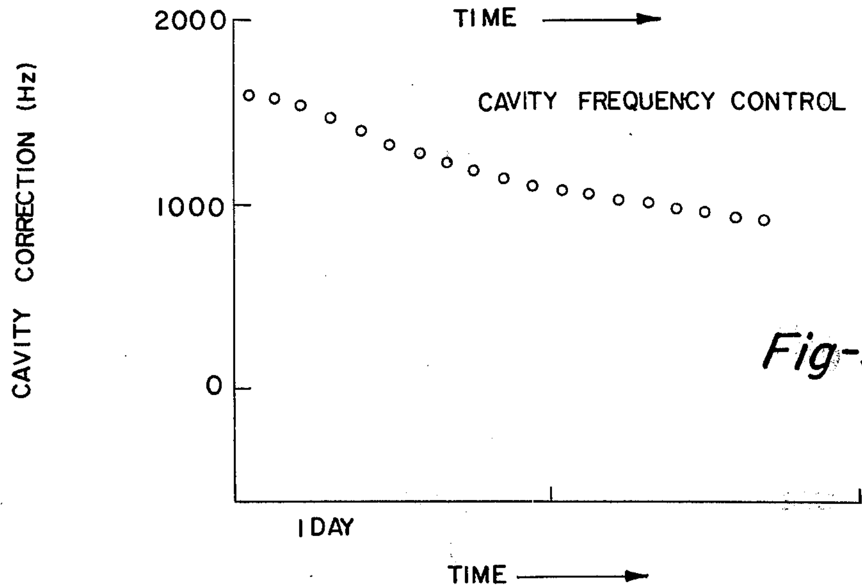
FIG. 3 is a graph showing cavity correction during the 0.7° C. temperature transient as shown in the graph of FIG. 2.

The ability of the cavity servo to correct for cavity changes is very clearly illustrated by FIGS. 2 and 3. FIG. 3 shows the cavity correction versus time after a 1° C. change in cavity temperature. The sensitivity is about 1 volt per 1 kHz change in uncorrected cavity frequency. FIG. 2 shows the beat period of the fully locked up passive hydrogen frequency standard over the same period of time vs. frequency standard National Bureau of Standards 6 (NBS-6). The frequency changed fractionally by about $7 \times 10^{-14}$ due to a 0.7° C. change in cavity temperature over the period in which the data was taken. This corresponds to an open loop change of about 700 Hz in cavity frequency. This fractional change of $7 \times 10^{-14}$ is probably due to a combination of a change in the wall shift and the second order Doppler shift, rather than an error in the cavity servo. Without the cavity servo of the invention, the frequency would change fractionally by $10^{-11}$.

These results mean that the cavity servo can correct for cavity changes on the order of 100 Hz or larger and still hold the perturbation of the output frequency below $1 \times 10^{-14}$. This relaxes the requirement of temperature stability by at least a factor of 100 as compared to any presently known stand-alone active cavity maser design. This obviously has tremendous implications in the engineering and materials cost of producing a frequency standard. Moreover, the elimination of oscillation threshold conditions would allow the use of a small inexpensive dielectrically loaded cavity which would greatly reduce cost. The inside of the dielectric cavity would also serve as the hydrogen storage bulb which would make the device more rugged.

The required cavity temperature stability for the passive maser is determined by the second order Doppler shift of $1.3 \times 10^{-13}$/° C. and a temperature dependence of the wall shift. This limit is about ± .070° C. for a fractional change $\pm 1 \times 10^{-14}$.

Figure 4:
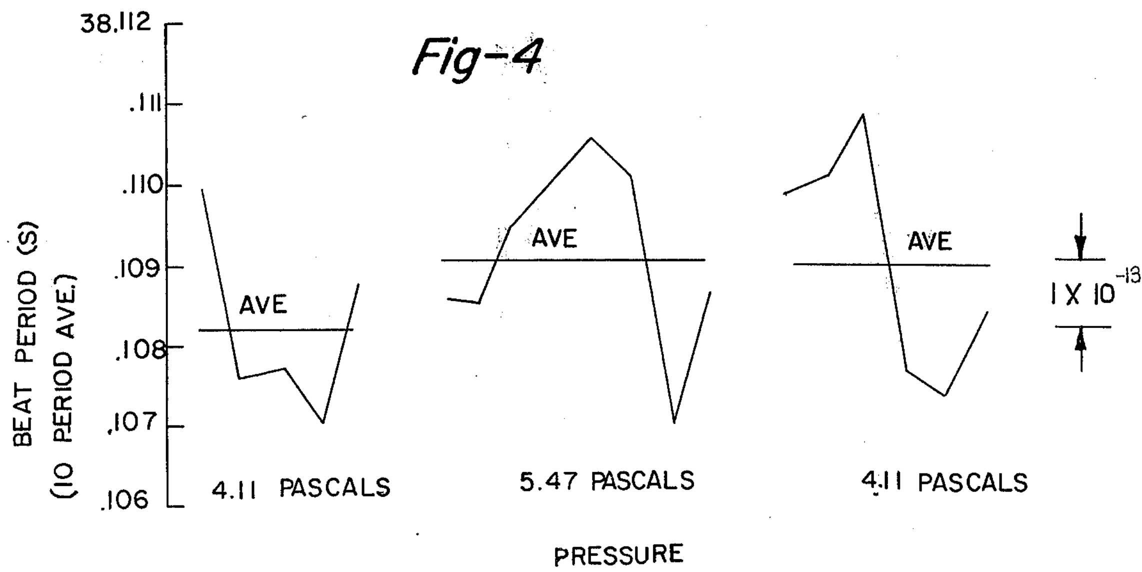
FIG. 4 is a graph showing beat period between the stabilized passive hydrogen maser as shown in FIG. 1 and National Bureau of Standards frequency standard known as NBS-6 at 5 MHz for a hydrogen pressure of 4.11 Pascals (0.309 Torr) and 5.47 Pascals (0.411 Torr).

Other parameters which might effect the frequency of such a passive hydrogen maser are variations in hydrogen beam intensity and variations in microwave power. FIG. 4 shows the data taken to measure the spin-exchange shift. A 33% increase in beam intensity produced a change of $\simeq 6 \pm 4 \times 10^{-14}$. Similarly, it was found that a change in microwave power of $-2$ dB caused a shift of about $8 \pm 4 \times 10^{-14}$. Both of these effects are small enough that they should not effect the stability at the $10^{-14}$ level. The time domain stability of the passive hydrogen maser for measurement times between 2000 *s* and 2.9*d* was measured against two high-performance cesium tubes in a three-corner hat arrangement, i.e., three pairs of beat frequency data were used to obtain an unbiased estimate of the stability of each clock (see FIG. 5).

Figure 5:
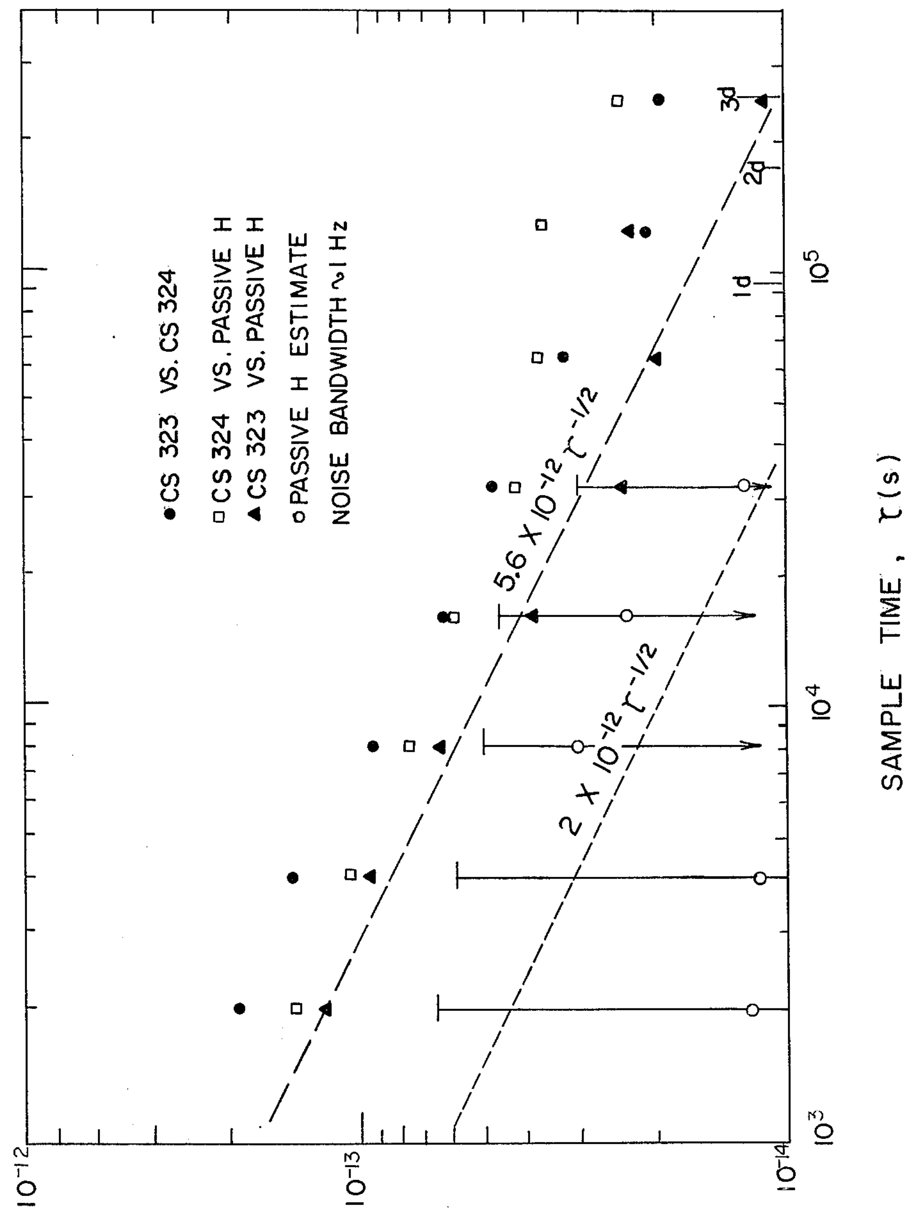
FIG. 5 is a stability plot for three concurrent beat frequencies between Cs 323, Cs 324, and passive hydrogen.

FIG. 5 shows primarily that the frequency stability of the passive hydrogen maser utilizing this invention is substantially better than that of Cs 324 and Cs 323, over the region from 2,000 *s* to 64,000 *s*. For example, the data at 2,000 *s* and 4,000 *s*, which have the best confidence, indicate that the short-term stability of the passive hydrogen is $6 \pm 27 \times 10^{-13}\tau^{-1/2}$ in a 1 Hz noise bandwidth.

Figure 6:
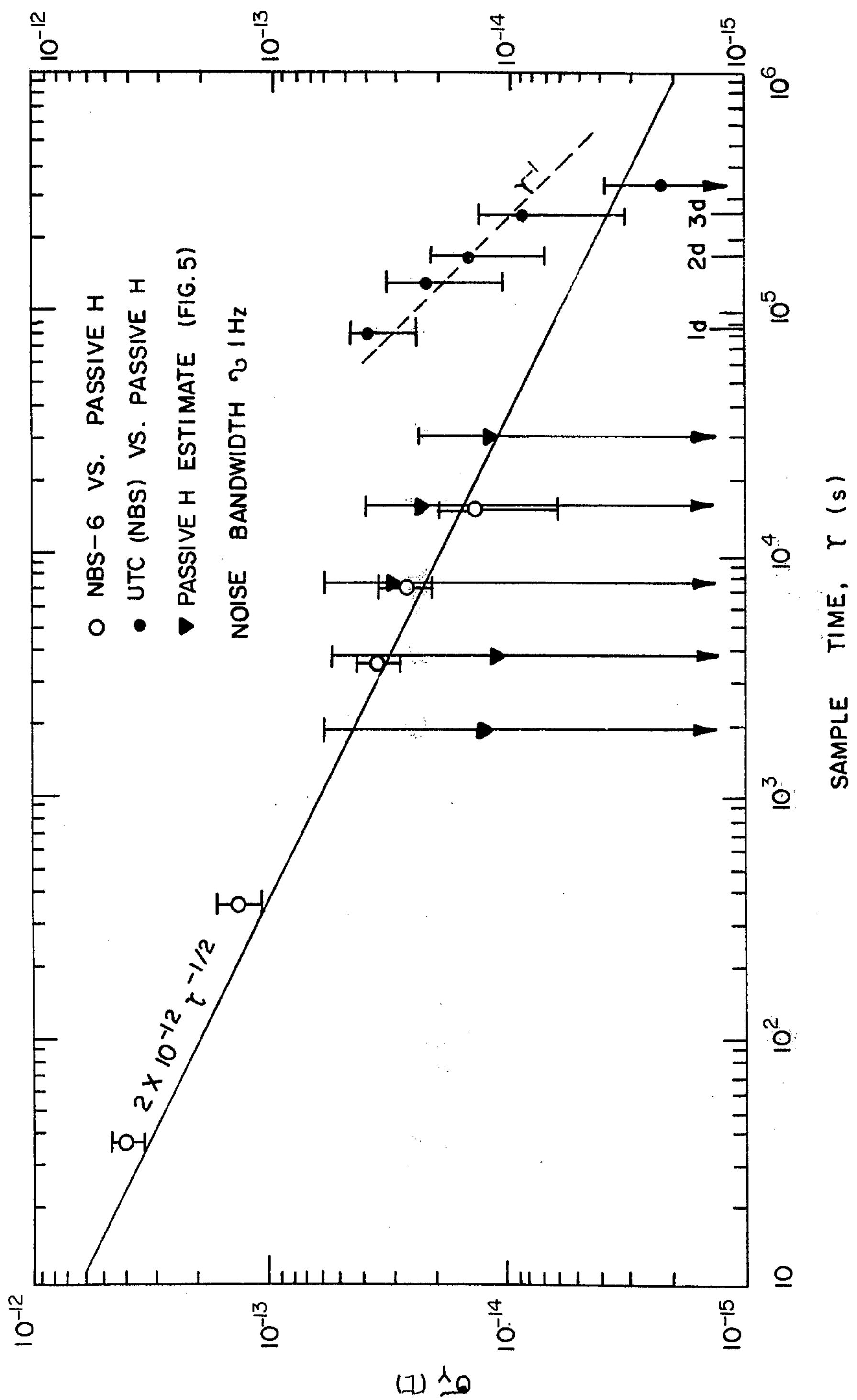
FIG. 6 is a summary of the time domain stability for the passive hydrogen maser with the system of this invention connected therewith as shown in FIG. 1.

The data of passive hydrogen versus NBS-6 (National Bureau of Standards frequency standard), one of the primary cesium standards now utilized by the U.S. National Bureau of Standards is shown in FIG. 6. This data shows that the stability of the pair is $2.2 \times 10^{-12}\tau^{-1/2}$ ($38\ s < \tau < 15{,}000$ s) and hence provides an upper limit on the stability of the passive hydrogen frequency standard. The long-term frequency stability of the passive hydrogen maser was assessed by comparison with the UTC (NBS) time scale comprised of 9 cesium standards including the primary cesium standard NBS-4 and NBS-6 (of the U.S. Bureau of Standards). The 5 MHz output from the passive maser was divided down to one pulse per second and compared to a similar one pulse per second tick originating from member clocks of the time scale. Daily differences were recorded with the accuracy of $\simeq 1.5$ ns. In this way the frequency of the passive maser at 1-day and longer averaging time could be measured.

Figure 7:
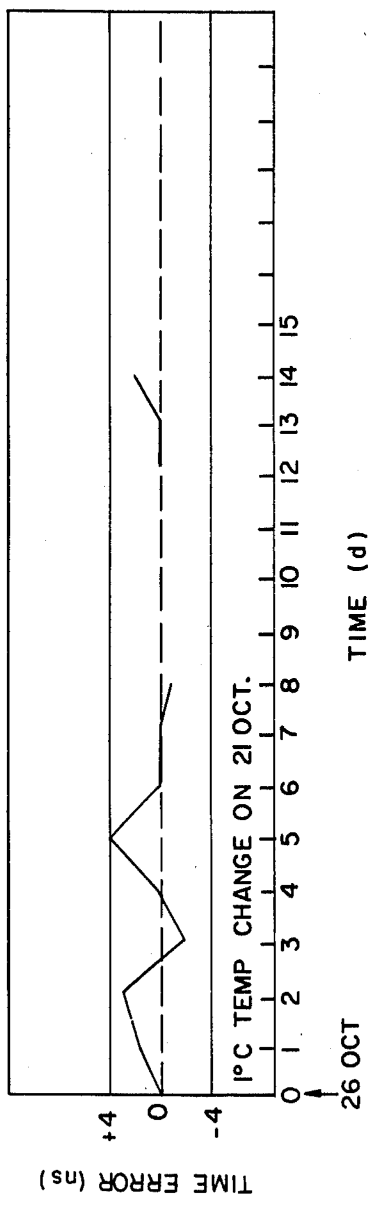
FIG. 7 is a graph showing time error of the stabilized passive hydrogen maser as shown in FIG. 1 (NBS) assuming an average frequency difference of 8900 ns/day (RMS time error 1.8 ns)
Figure 8:
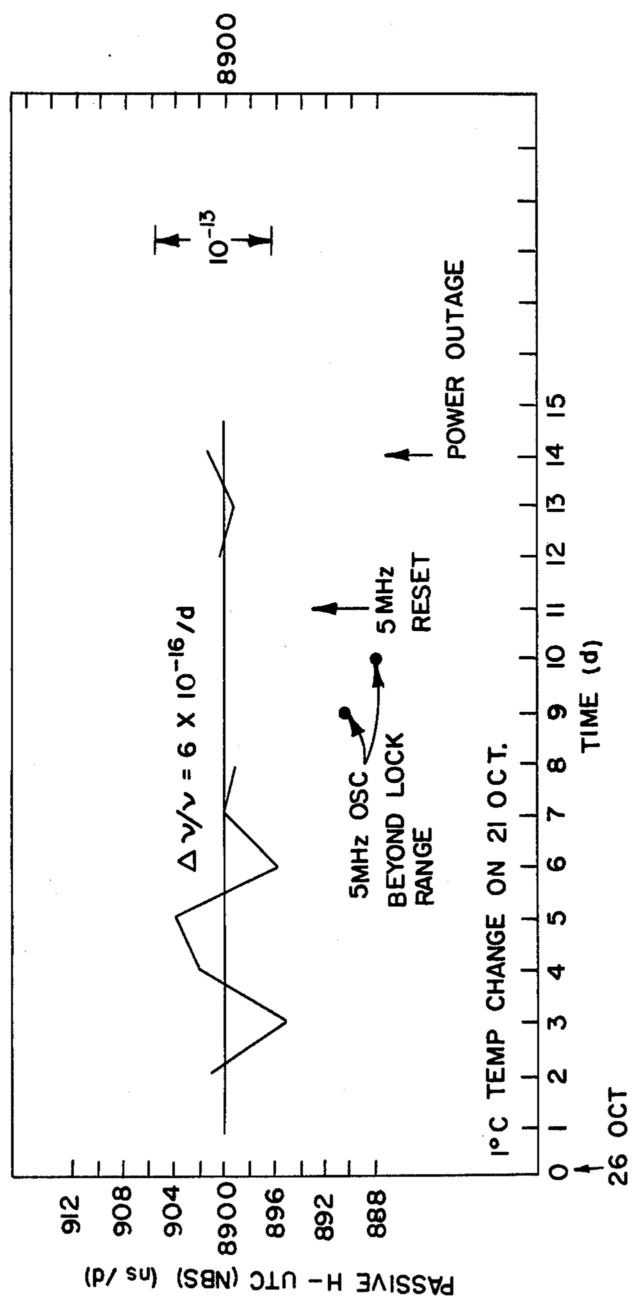
FIG. 8 is a graph showing the rate of passive hydrogen vs. UTC (NBS).

Frequency stability plots of this data are shown in FIGS. 6, 7, and 8. Frequency stability data is shown at FIG. 8 along with various notes of prevailing experimental conditions. As noted, this data was taken over several days following $\simeq$ 1° C. change in the cavity temperature. The data over the days 8–9 and 9–10 were anomalously low and an examination of the various monitors indicated that the crystal control servo loop was exceeding its dynamic range part of the time. The crystal oscillator was then reset within its dynamic range. The frequency then returned to its normal average of the first 8 days. On the morning of day 14, the analysis was terminated.

The square root of the Allan Variance derived from the data of FIGS. 7 and 8 is shown in FIG. 6. It is apparent that there is a more or less daily variation of frequency due to some environmental influence, which is above the level of white frequency fluctuation which was expected on the basis of data from 38 *s* to 15,000 *s*.

In spite of this, the stability at 3 days is $8.4 \pm 5 \times 10^{-15}$ and at 4 days it is $2.2 \pm 1.8 \times 10^{-15}$. It is expected that the noise level near 1 day, which acts like some sort of phase modulation, can be reduced by temperature control over the critical servo control electronics and some of the filters. At the present time however, none of the electronics is temperature controlled.

A least squares fit to the data of FIGS. 7 and 8 yield a linear drift of $6 \times 10^{-16}$/day which is within the measurement noise of the two end points. From the frequency stability data of FIG. 7, it can be shown that the expected time keeping accuracy over a 10 day prediction period has an uncertainty of less than 10 ns. In fact, over the 8 day period where continuous data exists, the maximum time excursion was 4 ns using an after the fact average frequency.

The long-term frequency stability presented in FIGS. 6 to 8, and especially the low-drift are the best known to have been documented for a single stand-alone hydrogen frequency standard, and it is as good as that observed with multiple hydrogen masers which are auto-tuned against one another or against a separate hydrogen maser.

This excellent long-term stability, as provided by this invention, has been accomplished with new electronic designs. Therefore, stabilities of this level or better can be achieved with many existing active masers by converting the electronics to the passive approach outlined with respect to the system as shown in FIG. 1, the main requirement being that the cavity have two coupling ports.

The passive electronics may also be used for a small dielectric cavity measuring ≃ 6 inches (15 cm.) diameter and 6 inches (15 cm.) long. It is expected that 10-day stabilities exceeding $1 \times 10^{-14}$ can also be achieved with a small cavity. This coupled with the other advantages of the passive approach, e.g., low hydrogen beam requirement, should make possible a hydrogen maser of exceptional stability measuring less than 15 inches in diameter and 36 inches long.

Moreover, it should be noted that the sensitivity of the passive hydrogen maser to environmental perturbation is greatly reduced over that of the present stand-alone active masers because of its rapid active cavity control, the lack of threshold conditions on beam flux, and its ability via equalization of the populations of the three upper spin states, to greatly reduce the magnetic field inhomogeneity shift (Crampton effect) without reducing the safety margin above a threshold condition.

While this invention has been described in conjunction with a passive hydrogen maser frequency standard, it is to be realized that the invention is not meant to be limited thereto since the system and method can be adapted for other utilizations as would be obvious to one skilled in the art, including, for example, utilization in conjunction with any laser standard stabilized by external cells as well as with other frequency and/or length standards, and other devices which use a reference line as an environmental sensor or monitor.

Moreover, phase or frequency modulation signals impressed on the probe signal can be used to probe cavities or dispersive elements such as filter or passband amplifiers external to the microwave cavity containing the hydrogen atoms and thereby to develop error signals for correcting such external cavities or dispersive elements.

It should be noted that various modulating signals may be impressed as phase modulation, frequency modulation or approximations thereof. The essential point is that the modulation be done in such a way that amplitude modulation, at the frequencies used in the various servo systems to correct the respective cavities and the local oscillator, present on the probe signal be small — ideally smaller than the allowable detuning caused amplitude modulation from the cavity structures and the reference line.

When the various cavity structures and/or reference lines have approximately the same Q factor, then it is possible to probe the various structures using only one modulating frequency since the modulator can be used to generate the second, third etc. modulating frequencies as harmonics of the first modulating frequency. The various error signals are then separated by observing the level and sign of the appropriate odd harmonic of the first modulating frequency as determined by the various Q factors, and the modulation width.

From the foregoing, it can be appreciated that this invention provides an improved system and method for frequency stabilization.

What is claimed is:

1. In a device for providing a frequency maintained electrical output signal with said device including a tunable element and frequency reference receiving a probe signal from probe means connected therewith with said probe means including frequency adjustable carrier signal generating means, a multiple modulation signal maintaining system, comprising:

modulating means for modulating said probe signal coupled to said tunable element and frequency reference with at least first and second modulating signals of different modulating frequencies; and detecting means for detecting the modulation of said different modulating frequencies on the output signal from said tunable element and frequency reference and coupling signals indicative thereof to said tunable element and said signal generating means for controlling tuning of said tunable element and adjustment of the frequency of said signal generating means to thus accurately maintain the frequency of said electrical output signal in a predetermined relationship with respect to said frequency reference.

2. The multiple modulation signal maintaining system of claim 1 wherein said modulating means includes a modulator receiving the output signal from said signal generating means, and first and second modulating signal generating means connected with said modulator for modulating said output signal from said signal generating means.

3. The multiple modulation signal maintaining system of claim 2 wherein said modulating means is a phase or frequency modulator and whereby said output signals from said signal generating means is phase or frequency modulated by said first and second modulating signals.

4. The multiple modulation signal maintaining system of claim 3 wherein said modulation on said probe signal is substantially free of amplitude modulation at the detected modulating frequencies.

5. The multiple modulation signal maintaining system of claim 1 wherein said detecting means includes first and second detectors for detecting the modulation of said different modulating frequencies on said output signal from said tunable element with the output of the first detector being coupled to said tunable element for controlling the tuning thereof and the output of said second detector being coupled to said signal generating means for adjustment of the frequency of the output signal therefrom.

6. The multiple modulation signal maintaining system of claim 5 wherein said first detector is connected to detect the fundamental or odd harmonics of said first modulating signal and said second detector is connected to detect the fundamental or odd harmonics of said second modulating signal.

7. The multiple modulation signal maintaining system of claim 1 wherein said tunable element is a resonant cavity structure, wherein said multiple modulated probe signal is coupled to said cavity structure, and wherein said multiple modulation stabilizing system provides long-term frequency stability for said output signal.

8. A multiple modulation system for frequency stabilization of an electrical output signal from a device that includes a tunable element having a frequency reference line therein and a tuning control means connected therewith, said system comprising:

- carrier signal generating means for generating a carrier signal;
- first and second modulating signal generating means for generating first and second modulating signals at different predetermined frequencies;
- modulating means for receiving said carrier signal from said carrier signal generating means and said modulating signals from said first and second modulating signal generating means whereby said modulating means provides an output signal that includes said carrier signal modulated by both said first and second modulating signals;
- probing means for processing said multiple modulated carrier signal and coupling a probe signal from said modulating means to said tunable element;
- first and second detecting means each of which is connected to said tunable element to receive said output signal therefrom and detect a different one of said modulating signals thereon, one of said detecting means producing an output signal indicative of frequency offsets between the tuned frequency of said tunable element and said probe signal and the other of said detecting means producing an output signal indicative of frequency offsets between said frequency reference line and said probe signal; and
- coupling means for coupling the output from said first and second detecting means to said tunable element and said carrier signal generating means for controlling tuning of said tunable element and adjustment of the frequency of said carrier signal generating means to thus accurately stabilize the frequency of said electrical output signal.

9. The multiple modulation system of claim 8 wherein said modulating means is a phase or frequency modulator receiving said carrier signal and both first and second modulating signals, wherein said first and second modulating signals are also coupled to different ones of said first and second detecting means and wherein said detectors detect the fundamental or odd harmonics of said modulating signals.

10. The multiple modulation system of claim 8 wherein the frequency of said carrier signal is less than that of the tuned frequency of said tunable element wherein the frequency of said first modulating signal is much less than the frequency of said carrier signal and much greater than the frequency of said second modulating signal, wherein said probing means includes multiplier means for multiplying said modulated output signal from said modulating means, signal synthesizing means, and mixer means connected to receive the outputs from said multiplier means and said signal synthesizing means and providing said probe signal coupled to said tunable element.

11. The multiple modulation system of claim 10 wherein said first modulating signal is generated at a frequency of 12.2 KHz, said second modulating signal is generated at a frequency of 0.4 Hz, said tuned frequency of said tunable element is at the hydrogen resonance frequency of about 1420 MHz, and said carrier signal is generated at a frequency of 5 MHz.

12. The multiple modulation system of claim 11 wherein said tunable element is a resonant cavity structure for one of an atomic and molecular frequency standard.

13. The multiple modulation system of claim 8 wherein said first and second modulating frequencies are harmonically related and produced within said modulating means.

14. A frequency stabilized device comprising:

- a cavity structure having a resonance line therein;
- output means connected with said cavity structure and providing an output signal to be maintained at said preselected frequency;
- cavity control circuitry connected with said output means from said cavity structure to tune said cavity;
- carrier signal generating means for generating a carrier signal;
- a first modulating signal generating means for generating a first modulating signal at a frequency much less than that of said carrier signal;
- a second modulating signal generating means for generating a second modulating signal much less than that of said carrier signal;
- a phase or frequency modulator receiving said carrier signal and said first and second modulating signals and producing an output signal including said carrier signal modulated by both of said modulating signals;
- a multiplier receiving said modulated carrier signal from said modulator and multiplying the same by a predetermined factor;
- a synthesizer producing an output signal at a predetermined frequency;
- a first mixer receiving the output signals from said multiplier and said synthesizer and providing a probe signal that is coupled to said cavity structure substantially at said preselected frequency;
- a second mixer receiving the output signal from said cavity structure and said multiplier and providing a difference output signal;
- a first detector connected to receive the output from said second mixer and said first modulating signal generating means and responsive thereto producing an output that is proportional to any frequency offset of said probe signal from said resonant frequency of said cavity structure;

a second detector connected to receive said output from said second mixer and said second modulating generating means responsive thereto producing an output that is proportional to any frequency offset of said probe signal from said resonance line; and coupling means for coupling said output from said first detector to said cavity control circuitry to cause tuning of said cavity structure to said preselected resonance line frequency, and for coupling said output from said second detector to said cavity signal generating means to adjust the frequency of said output signal therefrom so that the probe signal is caused to be adjusted to said preselected frequency of resonance line within said cavity structure whereby said output signal from said cavity structure is accurately maintained at said preselected frequency thereby insuring that said carrier signal is accurately frequency stabilized in long-term.

15. The frequency stabilized device of claim 14 wherein said synthesizer is connected with said carrier signal generating means, wherein said device includes a first frequency divider connected between said synthesizer and said first modulating signal generating means, and wherein said device includes a second frequency divider connected between said first frequency divider and said second modulating signal generating means.

16. A frequency stabilized device comprising;

a reference resonance line;

a cavity structure separate from said reference resonance line;

output means connected with said cavity structure and providing an output signal therefrom to be maintained at a predetermined frequency and therefore wavelength;

cavity control circuitry connected with said output means from said cavity structure to tune said cavity;

carrier signal generating means for generating a carrier signal;

a modulating signal generating means for generating first and second modulating signal;

a modulator for receiving said carrier signal and said modulating signals and providing an output that includes said carrier signal modulated by said modulating signals;

probe means for receiving and processing said modulated carrier signal and providing a probe signal to said cavity structure and also to said reference resonance line;

first detector means connected with said cavity structure output means and detecting said modulating signal on said output signal, said detector means providing an output indicative of any frequency offset of said probe signal from said resonant frequency of said cavity structure;

second detector means coupled to the reference resonance line and detecting means providing an output indicative of any frequency offset of said probe signal from said reference resonance line;

first coupling means for coupling said output from said first detector means to said cavity control circuitry to tune said cavity structure to said preselected reference resonance line; and second coupling means for coupling said output from said second detector means to correct said cavity signal generating means.

17. A frequency stabilized device comprising;

a reference resonance line;

a cavity structure;

output means connected with said cavity structure and providing an output signal therefrom to be maintained at a predetermined frequency and therefore wavelength;

cavity control circuitry connected with said output means from said cavity structure to change the length of said cavity;

carrier signal generating means for generating a carrier signal;

a modulating signal generating means for generating first and second modulating signal;

a modulator for receiving said carrier signal and said modulating signals and providing an output that includes said carrier signal modulated by said modulating signals;

probe means for receiving and processing said modulated carrier signal and providing a probe signal to said cavity structure and also to said reference resonance line;

first detector means connected with said cavity structure output means and detecting said modulating signal on said output signal, said detector means providing an output indicative of the difference between a multiple of the wave length of the probe radiation and the effective length of said cavity structure;

second detector means coupled to the reference resonance line and detecting means providing an output indicative of any frequency offset of said probe signal from said reference resonance line;

first coupling means for coupling said output from said first detector means to said cavity control circuitry to change the length of said cavity to thereby provide a frequency stabilized output signal and also a stabilized cavity length; and second coupling means for coupling said output from said second detector means to correct said cavity signal generating means.

18. The device of claim 17 wherein said reference resonance line is within said cavity structure.

19. The device of claim 17 wherein said reference resonance line is separate from said cavity structure.

20. A method for maintaining the frequency of an output signal from a device having a tunable element and frequency reference receiving a probe signal from probe means that includes frequency adjustable carrier signal generating means, said method comprising:

modulating said probe signal with first and second modulating signals having different frequencies prior to coupling said probe signal to said tunable element and to said frequency reference;

detecting modulation on said output signal from said tunable element and frequency reference at said different modulating frequencies and developing therefrom frequency error signals; and coupling said error signals to said tunable element and said signal generating means to control tuning of said tunable element and adjustment of the frequency of said carrier signal generating means to thereby accurately maintain the frequency of said output signal in a predetermined relationship with respect to said frequency reference.

21. The method of claim 20 wherein said probe signal is phase or frequency modulated by said first and second modulating signals of different frequencies, and wherein amplitude modulation is detected on said output signal from said tunable element with said frequency error signals being developed therefrom.

22. The method of claim 21 wherein the fundamental or odd harmonics of said amplitude modulation is detected on said output signal from said tunable element and frequency reference with said frequency error signals being developed therefrom.

23. The method of claim 22 wherein said modulation on said probe signal is substantially free of amplitude modulation at said detected modulating frequencies.

24. The method of claim 20 wherein said tunable element is a resonant cavity structure and wherein said tunable element is tuned by adjusting the length of said cavity.

25. The method of claim 24 wherein said method includes maintaining the length of said cavity in a predetermined relationship with respect to said frequency reference.

26. A method for stabilizing the frequency of an output signal from a device having a tunable element with a frequency reference line therein, said method comprising:

generating a carrier signal;

phase or frequency modulating said carrier signal with first and second modulating signals each of which are at different frequencies;

coupling said multiple modulated carrier signal to said tunable element so that said output signal from said tunable element is amplitude modulated by said modulating signals;

detecting the fundamental or odd harmonics of said amplitude modulation at each of said multiple modulating frequencies; and utilizing said detected amplitude modulation to tune said tunable element and to adjust the frequency of said carrier signal generating means to accurately stabilize said output signal.

27. The method of claim 26 wherein said carrier signal is generated at a frequency of less than that of the tuned frequency of said tunable element, modulated by both of said modulating signals, and then processed to provide a signal substantially at the tuned frequency of said tunable element.

28. The method of claim 27 wherein said amplitude modulated output signal is coupled from said tunable element so that the resulting amplitude at one of said modulating frequencies or odd harmonics thereof is proportional to the frequency offset between said carrier signal coupled to said tunable element and the tuned frequency of said tunable element and the resulting amplitude of the other of said modulating signal frequencies or odd harmonics thereof is proportional to the frequency offset of the carrier signal and said frequency resonance line.

29. The method of claim 27 wherein said carrier signal is phase or frequency modulated by said first and second modulating signals and then multiplied and mixed with a synchronous output to produce said multiple modulated output signal that is coupled to said tunable element.

30. The method of claim 26 wherein said tunable element is a resonant cavity structure and wherein said multiple modulated carrier signal is coupled to said structure and said output signal having said amplitude modulation thereon is coupled from said cavity structure.

31. The method of claim 30 wherein said preselected frequency is the 1,0 to 0,0 transition frequency in atomic hydrogen at approximately 1420 MHz, wherein said carrier signal is generated at 5 MHz, and wherein said carrier signal is modulated by first and second modulating signals at 12.2 KHz and 0.4 Hz, respectively.

32. A method for frequency stabilization of a device having a resonant cavity structure with a resonance line therein, said method comprising:

providing a cavity frequency control circuit;

generating a carrier signal;

phase or frequency modulating said carrier signal by first and second modulating signals each of which are at different frequencies much less than of said carrier signal;

frequency multiplying said modulated carrier frequency to a frequency greater than that of the tuned frequency of said resonant cavity structure;

generating a synthesizer signal;

mixing said frequency modulated carrier signal and said synthesized signal to produce a probe signal substantially at the tuned frequency of said resonant cavity structure;

coupling said probe signal to said resonant cavity structure and said resonance line;

coupling an output signal from said resonant cavity structure with said output signal being amplitude modulated by said modulating signals on said probe signal coupled to said resonant cavity structure, said resulting amplitude of one of said modulating frequencies being proportional to the frequency offset between said probe signal coupled to said resonant cavity structure and the tuned resonant frequency of said cavity structure and the resulting amplitude of the other of said modulating frequencies being proportional to the frequency offset between the probe signal and said resonance line;

mixing said output signal and said probe signal to produce a difference frequency output;

detecting said amplitude modulation of said one of said modulating frequencies on said difference frequency output to produce a first error signal;

detecting said amplitude modulation of said other of said modulating frequencies on said difference frequency output to produce a second error signal;

coupling said first error signal to said control circuit to tune said cavity to said preselected resonance frequency; and coupling said second error signal to said carrier signal generating means to adjust the frequency thereof to cause said probe signal to be adjusted to said resonance line.

33. The method of claim 32 wherein said resonance cavity structure is a hydrogen frequency standard for an atomic frequency standard and said preselected frequency is approximately 1420 MHz, wherein said carrier signal is generated at 5 MHz and multiplied to 1440 MHz, wherein said synchronous signal is generated to said 20 MHz, and wherein said first and second modulating signals are generated at 0.4 Hz and 12.2 KHz, respectively.

* * * * *